United States Patent
Jung

(10) Patent No.: US 11,246,216 B2
(45) Date of Patent: Feb. 8, 2022

(54) PRINTED CIRCUIT BOARD AND DISPLAY MODULE COMPRISING THE SAME

(71) Applicant: SAMSUNG ELECTRO-MECHANICS CO., LTD., Suwon-si (KR)

(72) Inventor: Myeong Hui Jung, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/124,942

(22) Filed: Dec. 17, 2020

(65) Prior Publication Data

US 2021/0282265 A1 Sep. 9, 2021

(30) Foreign Application Priority Data

Mar. 3, 2020 (KR) .................. 10-2020-0026528

(51) Int. Cl.
*H05K 1/16* (2006.01)
*H05K 1/11* (2006.01)

(52) U.S. Cl.
CPC .............. *H05K 1/113* (2013.01); *H05K 1/118* (2013.01); *H05K 2201/10128* (2013.01)

(58) Field of Classification Search
CPC ............... H05K 1/113; H05K 1/118; H05K 2201/10128
USPC .......................................................... 174/260
See application file for complete search history.

(56) References Cited

U.S. PATENT DOCUMENTS

| | | | |
|---|---|---|---|
| 2004/0118595 A1* | 6/2004 | Flammer | H05K 1/118 174/254 |
| 2004/0152259 A1* | 8/2004 | Seo | H01L 28/91 438/253 |
| 2009/0098776 A1* | 4/2009 | Park | H05K 1/182 439/630 |
| 2014/0367658 A1* | 12/2014 | Kwak | H01L 27/1218 257/40 |
| 2015/0083476 A1* | 3/2015 | Kim | H05K 3/4644 174/260 |
| 2016/0120025 A1* | 4/2016 | Kim | H05K 1/0218 174/350 |
| 2016/0242287 A1* | 8/2016 | Takemura | H01L 23/49827 |
| 2020/0008305 A1* | 1/2020 | Clark | B23K 26/0604 |

FOREIGN PATENT DOCUMENTS

| | | |
|---|---|---|
| JP | H07-010965 U | 2/1995 |
| KR | 10-2013-0019211 A | 2/2013 |

* cited by examiner

*Primary Examiner* — Andargie M Aychillhum
(74) *Attorney, Agent, or Firm* — Morgan, Lewis & Bockius LLP

(57) ABSTRACT

The present disclosure relates to a printed circuit board including a first insulating layer; and a plurality of connection pads disposed on one surface of the first insulating layer, wherein the first insulating layer has a groove portion penetrating a portion of the first insulating layer in respective regions between the plurality of connection pads, and a display module including the same.

20 Claims, 5 Drawing Sheets

PRINTED CIRCUIT BOARD AND DISPLAY MODULE COMPRISING THE SAME

CROSS-REFERENCE TO RELATED APPLICATION(S)

This application claims the benefit of priority to Korean Patent Application No. 10-2020-0026528 filed on Mar. 3, 2020 in the Korean Intellectual Property Office, the disclosure of which is incorporated herein by reference in its entirety.

TECHNICAL FIELD

The present disclosure relates to a printed circuit board and a display module comprising the same.

BACKGROUND

When a printed circuit board is connected through a bonding layer such as a display panel, a problem regarding bonding force between connection pads of each of the printed circuit board and the display panel is constantly being raised. In particular, due to pattern miniaturization of the connection pad, a pitch between pads may become smaller, and as the number of pads increases, an adhesive area of the insulating layer contacting the bonding layer decreases, and thus, adhesion to the bonding layer may be further lowered. In addition, when a flexible region of the printed circuit board is bent or folded, there is a problem in that detachment between the printed circuit board and the display panel may more easily occur due to a spring back phenomenon and may be separated from each other.

SUMMARY

An aspect of the present disclosure is to provide a printed circuit board having an increased adhesive area with a bonding layer and a display module including the same.

Another aspect of the present disclosure is to provide a printed circuit board having improved adhesion with a bonding layer and a display module including the same.

According to an aspect of the present disclosure, a printed circuit board includes: a first insulating layer; and a plurality of connection pads disposed on one surface of the first insulating layer, wherein the first insulating layer may have a groove portion penetrating a portion of the first insulating layer in respective regions between the plurality of connection pads.

According to an aspect of the present disclosure, a display module includes: a printed circuit board including an insulating layer and a plurality of first connection pads disposed on one surface of the insulating layer; a printed circuit board having a flexible region including an insulating layer and a plurality of first connection pads disposed on one surface of the insulating layer; a display panel including a plurality of second connection pads; and a bonding layer disposed between the flexible region of the printed circuit board and the display panel, and connecting the first connection pad and the second connection pad, wherein the insulating layer may have a plurality of groove portions penetrating at least a portion of the insulating layer in the flexible region of the printed circuit board.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

Electronic Device

Figure 1:
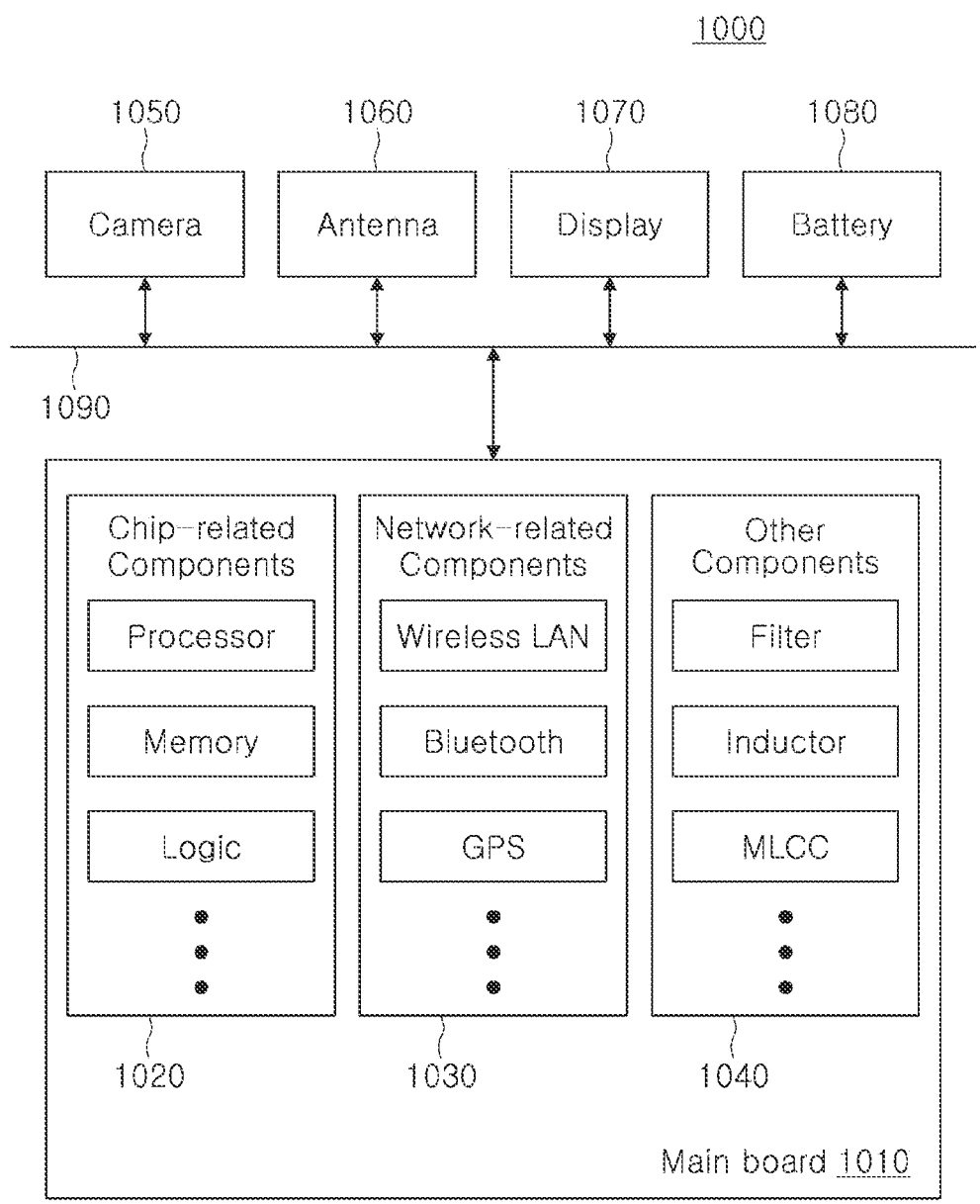
FIG. 1 is a block diagram schematically illustrating an example of an electronic device system.

FIG. 1 is a schematic view illustrating an example of a block diagram of an electronic device system according to an example.

Referring to FIG. 1, an electronic device 1000 may receive a motherboard 1010. The motherboard 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), amass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
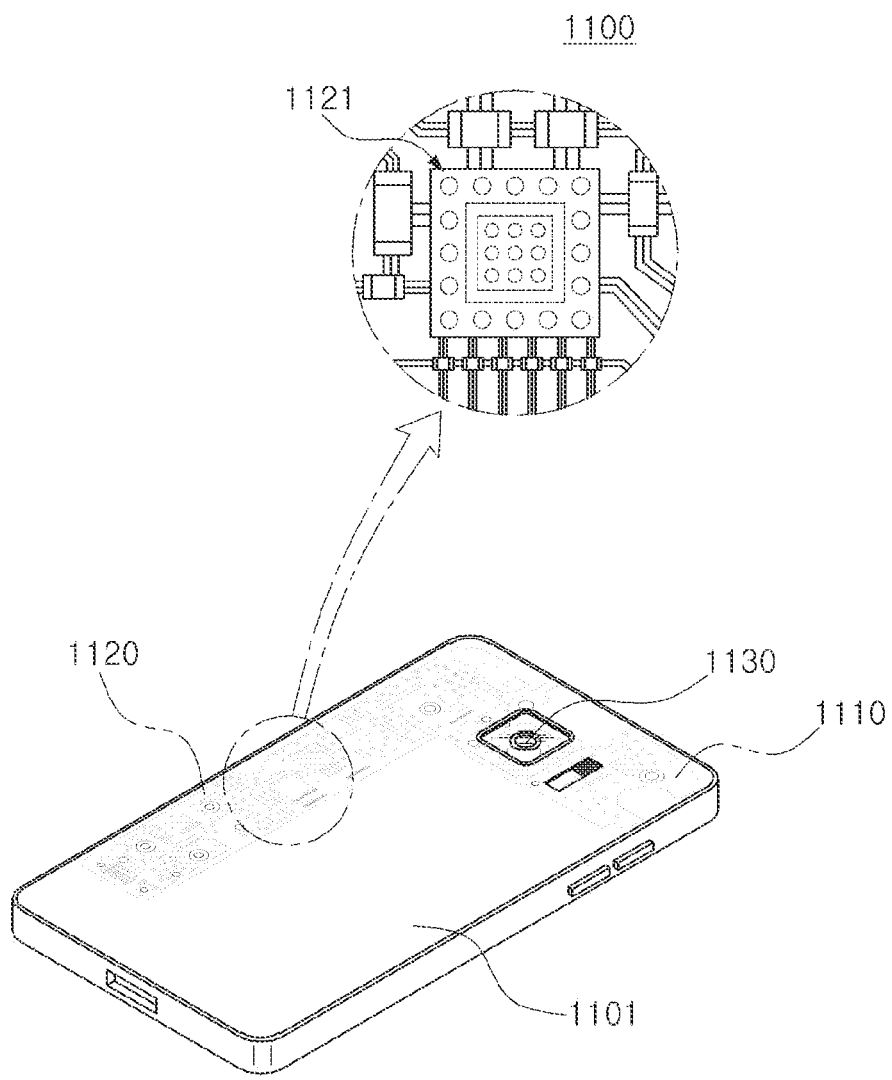
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the printed circuit board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type, such as a semiconductor chip or a passive component on a package board of a multilayer printed circuit board, but is not limited thereto. Meanwhile, the electronic device is not necessarily limited to the smartphone 1100, but may be other electronic devices as described above.

Printed Circuit Board and Display Module

Figure 3:
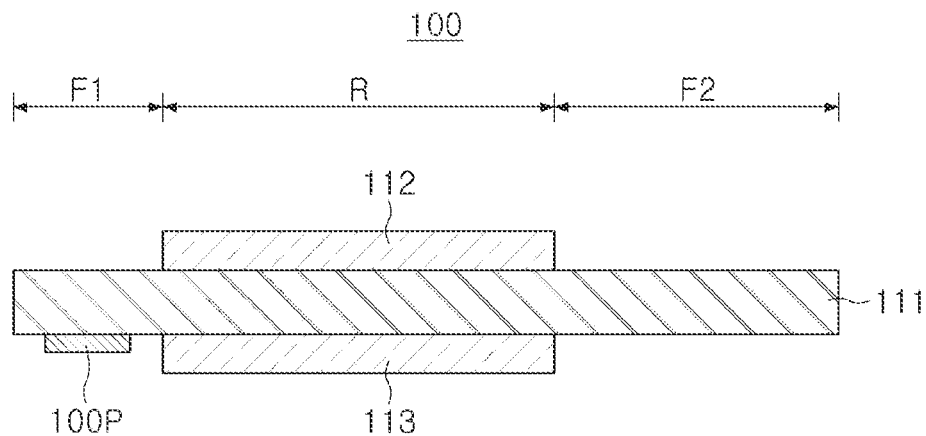
FIG. 3 is a cross-sectional view schematically illustrating an example of a printed circuit board according to the present disclosure.

FIG. 3 is a cross-sectional view schematically illustrating an example of a printed circuit board according to the present disclosure.

Figure 4:
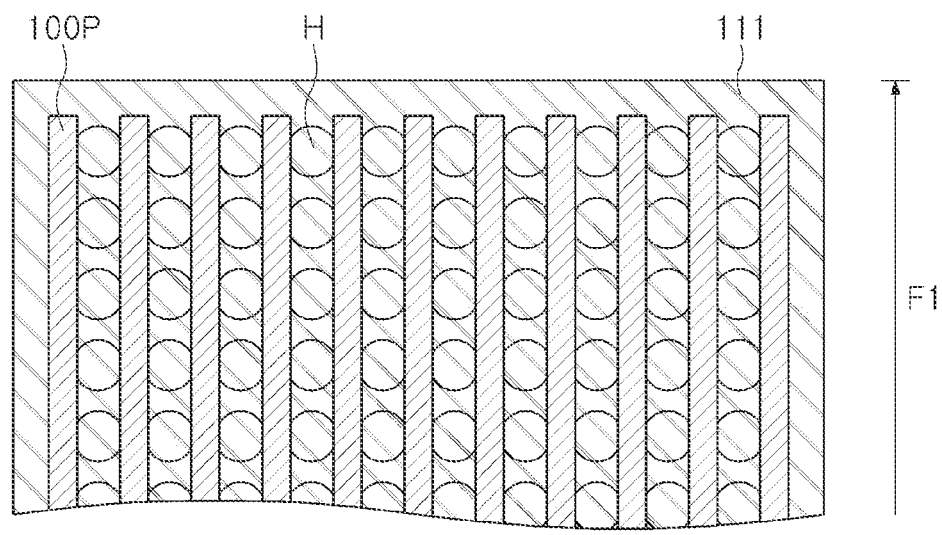
FIG. 4 is a partial plan view of a first flexible region of a printed circuit board according to an example.

FIG. 4 is a partial plan view of a first flexible region of a printed circuit board according to an example.

Figure 5:
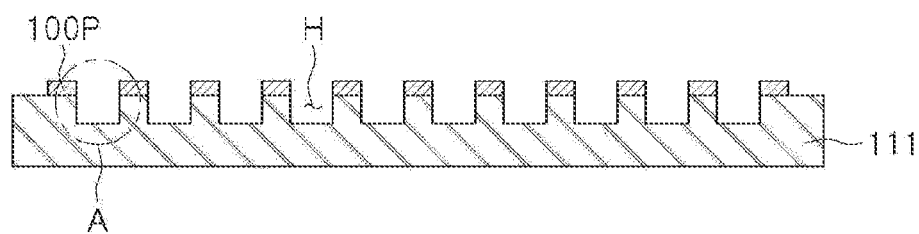
FIG. 5 is a partial cross-sectional view of a first flexible region of a printed circuit board according to an example.

FIG. 5 is a partial plan view of a first flexible region of a printed circuit board according to an example.

A printed circuit board 100 has a first flexible region F1. As described later, the printed circuit board 100 may be connected to a display panel, or the like. In this case, the first flexible region F1 may be a region in which a bonding layer for connection with the display panel is disposed.

The printed circuit board 100 also includes a first insulating layer 111 and a plurality of connection pads 100P disposed on one surface of the first insulating layer 111. In this case, the connection pad 100P may be disposed in the first flexible region F1 of the printed circuit board 100. In addition, at least a portion of the first insulating layer 111 may be disposed in the first flexible region F1 of the printed circuit board 100. Accordingly, the first flexible region F1 of the printed circuit board 100 may include a first insulating layer 111 and a plurality of connection pads 100P.

The first insulating layer 111 has a groove portion H penetrating a portion of the first insulating layer 111 in respective regions between the plurality of connection pads 100P. Accordingly, the groove portion H may also be disposed in the first flexible region F1 of the printed circuit board 100, similarly to the first insulating layer 111 and the plurality of connection pads 100P. However, in some cases, the groove portion H may penetrate the entire first insulating layer 111.

Meanwhile, when a printed circuit board is connected through a bonding layer such as a display panel, a problem regarding bonding force between connection pads of each of the printed circuit board and the display panel is constantly being raised. In particular, due to pattern miniaturization of the connection pad, a pitch between pads becomes smaller, and as the number of pads increases, an adhesive area of the insulating layer that can contact the bonding layer decreases, and thus adhesion to the bonding layer may be further lowered. In addition, when the flexible region of the printed circuit board is bent or folded, there is a problem that detachment between the printed circuit board and the display panel becomes easier due to a spring back phenomenon and both can be separated from each other.

In the case of the printed circuit board 100 according to the present disclosure, a plurality of groove portions H penetrating a portion of the first insulating layer 111 is formed in the first flexible region F1 in which the bonding layer is disposed. Accordingly, when connecting the first flexible region F1 of the printed circuit board 100 to a display panel or the like, through a bonding layer, the bonding layer may fill at least a portion of each of the plurality of groove portions H. That is, a bonding layer may be disposed in at least a portion of each of the plurality of groove portions H, and an adhesive area of the first insulating layer 111, in contact with the bonding layer, may be increased. For example, the bonding layer may cover a wall surface and a bottom surface of each of the plurality of groove portions H, and may fill an interior of each of the plurality of groove portions H. Thereby, adhesion between the first insulating layer 111 and the bonding layer can be improved. In addition, it is possible to improve bonding force between the printed circuit board 100 and the display panel.

The printed circuit board 100 has a first flexible region F1 as described above. In addition, the printed circuit board 100 may further have a rigid region R and/or a second flexible region F2. The rigid region R and/or the second flexible region F2 may be a region extending from the first flexible region F1. However, the present disclosure is not limited thereto, and a dispositional relationship and the number of flexible regions and rigid regions of the printed circuit board 100 may be changed depending on design.

Meanwhile, each of the first flexible region F1 and the second flexible region F2 refers to a region that is easier to be bent or folded than the rigid region. On the other hand, the rigid region R refers to a region that is more difficult to bend or fold than the first flexible region F1 or the second flexible region F2. That is, terminology related to the first flexible region F1, the second flexible region F2, and the rigid region R are for describing relative characteristics between the respective regions, and it is not interpreted as being limited to a region in which the rigid region R cannot be bent or folded.

The connection pad 100P may be disposed on one surface of the first insulating layer 111 to electrically connect the printed circuit board 100 with other components such as a display panel.

As shown in the drawings, the connection pad 100P may protrude from the one surface of the printed circuit board 100 and the first insulating layer 111. As shown in the drawings, the connection pad 100P may protrude from the one surface of the printed circuit board 100 and the first insulating layer 111.

As a formation material of the connection pad 100P, a conductive material such as copper (Cu), aluminum (Al), silver (Ag), tin (Sn), gold (Au), nickel (Ni), lead (Pb), titanium (Ti), or alloys thereof can be used.

A plurality of connection pads 100P may be disposed to be spaced apart from each other on the one surface of the first insulating layer 111, for example, may be disposed to be substantially parallel so as not to overlap each other as shown in the drawings. However, the present disclosure is not limited thereto, and may be disposed in a wedge shape in which a gap between the plurality of connection pads 100P is widened from one side to the other side in a length direction of the connection pad 100P. The length direction of the connection pad 100P may be a direction perpendicular to a direction in which the plurality of connection pads 100P are disposed.

As described above, the printed circuit board 100 includes the first insulating layer 111.

At least a portion of the first insulating layer 111 is disposed in the first flexible region F1. Other portions of the first insulating layer 111 may be disposed in the rigid region R and/or the second flexible region F2, for example, may be disposed to extend to the first flexible region F1, the rigid region R, and the second flexible region F2. As another example, the first insulating layer 111 may be disposed only in the first flexible region F1, or may only be disposed in the first flexible region F1 and the second flexible region F2, but is not limited thereto.

The first insulating layer 111 may have a characteristic that is easy to bend or fold. That is, the first insulating layer 111 may be made of a flexible material having a low elastic modulus. Accordingly, the printed circuit board 100 may be bent and/or folded by the first insulating layer 111 in the first flexible region F1.

For example, as a formation material of the first insulating layer 111, polyimide (PI), polyethylene terephthalate (PET), polyethylene naphthalate (PEN), polycarbonate (PC), polyethersulfone (PES), polyacrylate (PAR), a liquid crystal polymer (LCP), and the like, may be used. In addition, the first insulating layer 111 may not contain reinforcing materials such as glass fibers and/or fillers.

The number of the first insulating layers 111 is not particularly limited, and may be composed of a plurality of layers as shown in the drawing. In this case, the material and/or thickness of each of the plurality of first insulating layers 111 may be the same as each other, or may be different from each other.

When the first insulating layer 111 is also disposed in the rigid region R and/or the second flexible region F2, the number of the first insulating layer 111 disposed in the rigid region R and/or the second flexible region F2 may be the same as the number of the first insulating layer 111 disposed in the first flexible region F1, or may be different from each other.

The first insulating layer 111 has a groove portion H penetrating a portion of the first insulating layer 111 in respective regions between the plurality of connection pads 100P. Accordingly, the groove portion H may also be disposed in the first flexible region F1 of the printed circuit board 100, similarly to the first insulating layer 111 and the plurality of connection pads 100P. The groove portion H may penetrate a portion of the first insulating layer 111 in each of the first insulating layer 111, in a direction of an other surface, opposite to the one surface in which the plurality of connection pads 100P are disposed. Accordingly, a bottom surface of the groove portion H may be disposed at a level between the one surface and the other surface of the first insulating layer 111. However, in some cases, the groove portion H may penetrate the entire first insulating layer 111.

In the case of the printed circuit board 100 according to the present disclosure, a plurality of groove portions H penetrating a portion of the first insulating layer 111 are formed in the first flexible region F1 in which the bonding layer is disposed. Accordingly, when connecting the first flexible region F1 of the printed circuit board 100 to a display panel, or the like through a bonding layer, the bonding layer may fill at least a portion of each of the plurality of groove portions H. That is, a bonding layer may be disposed in at least a portion of each of the plurality of groove portions H, and an adhesive area of the first insulating layer 111 may be increased. For example, the bonding layer may cover the wall surface and the bottom surface of each of the plurality of groove portions H, and may fill an interior of each of the plurality of groove portions H. Thereby, adhesion between the first insulating layer 111 and the bonding layer can be improved. In addition, it is possible to improve the bonding force between the printed circuit board 100 and the display panel.

The groove portion H may be formed in respective regions between the connection pads 100P adjacent to each other. Therefore, the plurality of connection pads 100P and the groove portions H may be alternately disposed on a plane. However, a groove portion H may not be formed in respective regions between some of the connection pads 100P and the connection pads 100P adjacent thereto, and thus a groove portion H may not be formed in some of the regions between the connection pads 100P adjacent to each other.

As shown in the drawings, a plurality of groove portions H may be formed in respective regions between the plurality of connection pads 100P. The plurality of groove portions H formed in respective regions between the plurality of connection pads 100P may be spaced apart from each other. Therefore, the plurality of connection pads 100P and the plurality of groove portions H may be alternately disposed on a plane. In this case, the number of groove portions H formed in the respective regions between the plurality of connection pads 100P is not particularly limited. In addition, the number of groove portions H formed in the respective regions between the plurality of connection pads 100P may be the same or may be different. As described above, the groove portion H may not be formed in a portion of the region between the plurality of connection pads 100P.

A method of forming the groove portion H is not particularly limited, and may be formed by, for example, a laser method. When the groove portion H is formed by a laser method, the connection pad 100P may not processed, and only the first insulating layer 111 is processed to form the groove portion H.

In this case, by adjusting power, or the like, of a shot of a laser, it is possible to forma groove portion H penetrating only a portion of the first insulating layer 111. In addition, by disposing a plurality of laser beams, a plurality of groove portions H can be formed at the same time.

The wall surface of the groove portion H may include a region having a shape extending from a side surface of the connection pad 100P. Accordingly, there may be a region in which the side surface of the connection pad 100P and the wall surface of the groove portion H are continuously connected from one surface of the first insulating layer 111 to the other surface thereof. From a similar point of view, the wall surface of the groove portion H may include a region in contact with the side surface of the connection pad 100P on a plane. When the groove portion H is formed with a laser as described above, since the connection pad 100P formed of metal, or the like is not processed, the groove portion H may be formed along the side surface of the connection pad 100P.

The width of the groove portion H may be narrower from the one surface to the other surface of the first insulating layer 111. In this case, the slope of the wall surface of the groove portion H is not constant in cross-section and may be different for each region.

The wall surface of the groove portion H may include a region having a curved surface. In addition, a bottom surface of the groove portion H may also include a region having a curved surface. That is, at least one of the wall surface and the bottom surface of the groove portion H may include a region having a curved surface. In addition, a boundary between the wall surface and the bottom surface of the groove portion may also include a region having a curved surface.

The shape of the groove portion H is not particularly limited. When forming the groove portion H by a laser method, each of the plurality of patterns may have a circular shape. However, the shape of the groove portion H is not limited to a circle, and may be, for example, a triangle, a square, a rectangle, a hexagon, a triangle, or any other regular or irregular convex polygon.

A rigid region R of the printed circuit board 100 may have a greater thickness than each of the first flexible region F1 and the second flexible region F2. In addition, the rigid region R may further include a second insulating layer 112 and/or a third insulating layer 113, disposed on the first insulating layer 111 and formed of a relatively rigid material having a higher elastic modulus than the first insulating layer 111.

Therefore, the printed circuit board 100 may have characteristics that are difficult to be bent or folded in the rigid region R.

For example, a material for forming each of the second insulating layer 112 and the third insulating layer 113 may include a thermosetting resin such as an epoxy resin, a thermoplastic resin such as a polyimide resin, or a resin impregnated with a core material such as glass fiber (glass cloth, and glass fabric) together with an inorganic filler, for example, an insulating material such as prepreg, an Ajinomoto Build-up Film (ABF), FR-4, bismaleimide triazine (BT), or the like. However, the present disclosure is not limited thereto, and in some cases, each of the second insulating layer 112 and the third insulating layer 113 may include the same material as the first insulating layer 111. The second insulating layer 112 and the third insulating layer 113 may include the same material as each other, or may include different materials from each other.

In addition, the printed circuit board 100 may further include at least one or more wiring layers capable of providing various wirings. At least a portion of the wiring layers may be electrically connected to a plurality of connection pads 100P.

In addition, the printed circuit board 100 may further include a via layer for connecting the wiring layer and/or a plurality of connection pads 100P. The via layer may penetrate at least one of the first insulating layer 111, the second insulating layer 112, and the third insulating layer 113.

Each of vias of the via layer may be a filled-type via in which an inside of via holes is completely filled with a conductive material, or the via may be formed such that the conductive material may be formed along the wall of the via holes. When the via is formed such that the conductive material is formed along the wall of the via holes, the inside of the via hole may be filled with an insulating material. The shape of the via may have a known shape such as a cylindrical shape or a tapered shape FIGS. 6A to 6E are enlarged views of region A of FIG. 5.

FIGS. 6A to 6E are intended to indicate that the groove portion H may have various shapes, and the shape of the groove portion H is not limited to the shapes illustrated in the drawings.

As shown, the wall surface of the groove portion H may include a region having a shape extending from the side surface of the connection pad 100P. Accordingly, there may be a region in which the side surface of the connection pad 100P and the wall surface of the groove portion H are continuously connected from the one surface of the first insulating layer 111 to the other surface thereof. From a similar point of view, the wall surface of the groove portion H on a plane may include a region in contact with the side surface of the connection pad 100P. When the groove portion H is formed with a laser as described above, since the connection pad 100P formed of metal, or the like is not processed, the groove portion H may be formed along the side surface of the connection pad 100P.

As described above, when the groove portion H is formed by a laser method, the connection pad 100P is not processed and only the first insulating layer 111 is processed so that the groove portion H may be formed along the side surface of the connection pad 100P. However, a method of forming the groove portions H is not limited to laser processing.

Figure 6A:
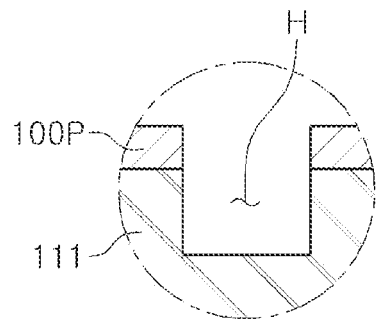
FIGS. 6A to 6E are enlarged views of region A of FIG. 5.
Figure 6B:
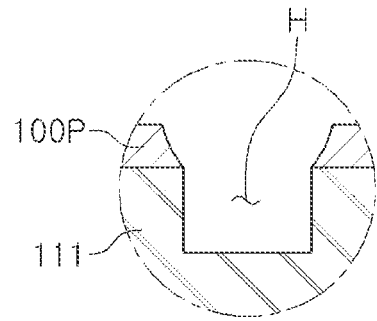
Figure 6C:
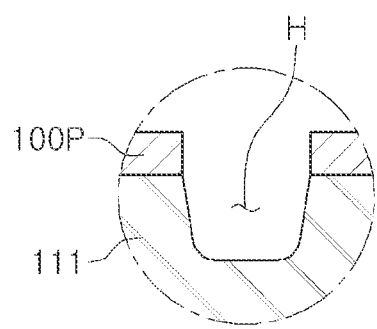
Figure 6D:
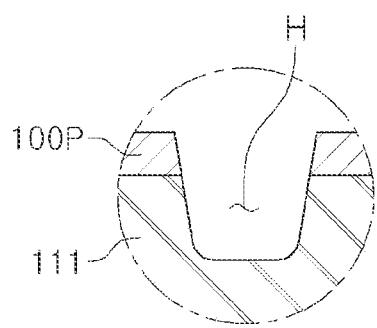
Figure 6E:
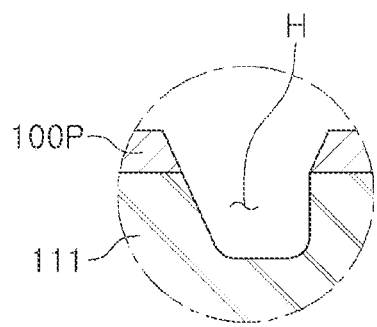

The width of the groove portion H may be narrower from the one surface of the first insulating layer 111 to the other surface thereof. In this case, a slope of the wall surface of the groove portion H may not be constant in a cross-section thereof and may be different for each region. In addition, as illustrated in FIG. 6E, the width of the groove portion H may become narrower from the one surface of the first insulating layer 111 to the other surface in some areas, and may be constant in other areas.

The wall surface of the groove portion H may include a region having a curved surface. In addition, the bottom surface of the groove portion H may also include a region having a curved surface. That is, at least one of the wall surface and the bottom surface of the groove portion H may include a region having a curved surface. In addition, a boundary between the wall surface and the bottom surface of the groove portion may also include a region having a curved surface.

Figure 7:
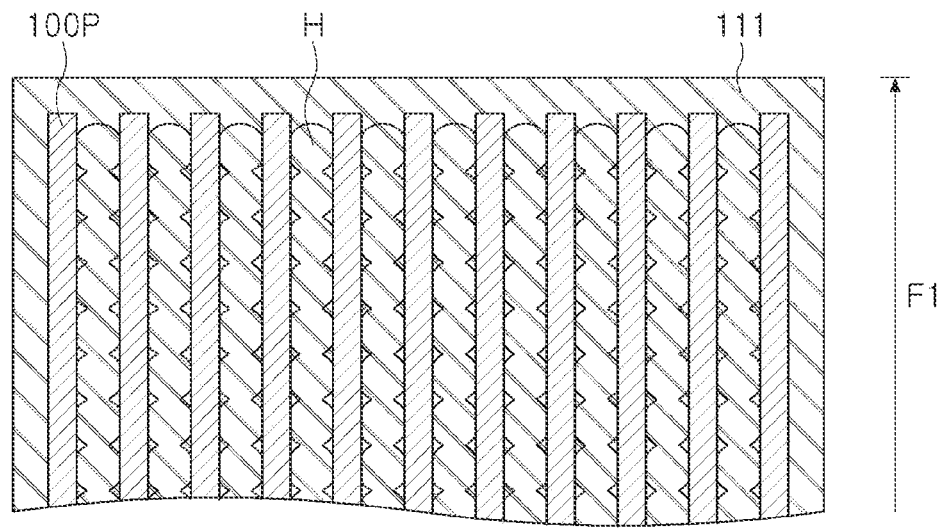
FIG. 7 is a partial plan view of a first flexible region of a printed circuit board according to another example.

FIG. 7 is a partial plan view of a first flexible region of a printed circuit board according to another example.

Referring to FIG. 7, a plurality of groove portions H may be formed in respective regions between a plurality of connection pads 100P, and the plurality of groove portions H formed in the respective regions between the plurality of connection pads 100P may be connected with each other. Therefore, the plurality of groove portions H may have a shape in which a plurality of patterns are connected on a plane. For example, as illustrated in the drawing, the first insulating layer 111 may have a plurality of groove portions H connected to the respective regions between the plurality of connection pads 100P in a longitudinal direction of the connection pad 100P.

The shape of each of the plurality of patterns is not particularly limited. When the groove portion H is formed by a laser method, each of the plurality of patterns may have a circular shape. However, the shape of each of the plurality of patterns may not be limited to a circle and may be, for example, a triangle, a square, a rectangle, a hexagon, a triangle, or any other regular or irregular convex polygon.

Other descriptions are substantially the same as those described above, and detailed descriptions thereof are omitted.

Figure 8:
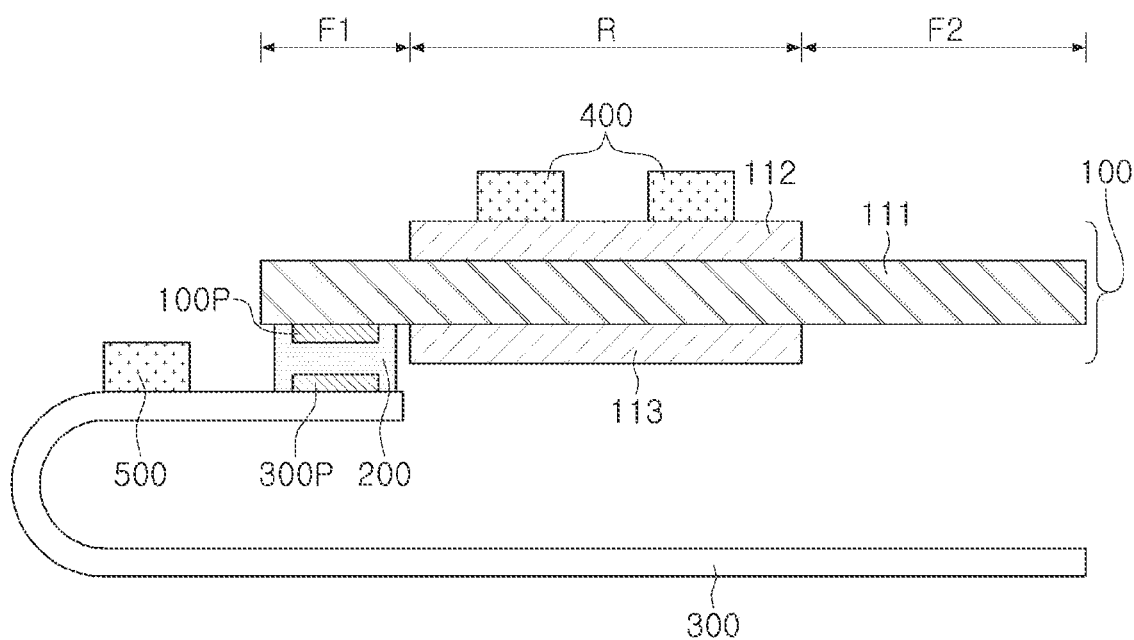
FIG. 8 is a cross-sectional view schematically illustrating an example of a display module according to the present disclosure.

FIG. 8 is a cross-sectional view schematically illustrating an example of a display module according to the present disclosure.

Referring to FIG. 8, a display module according to an example includes a printed circuit board 100, a bonding layer 200, and a display panel 300.

The printed circuit board 100 has a first flexible region F1. The printed circuit board 100 may be connected to the display panel 300, and in this case, the first flexible region F1 may be a region in which the bonding layer 200 for forming a connection with the display panel 300 is disposed. Accordingly, each of the connection pad 300P of the display panel 300 and the bonding layer 200 may be disposed in a region corresponding to the first flexible region F1 of the printed circuit board 100.

As described above, the printed circuit board 100 includes a first insulating layer 111 and a plurality of connection pads 100P disposed on the one surface of the first insulating layer 111. The connection pad 100P of the printed circuit board 100 may be disposed in the first flexible region F1 of the printed circuit board 100. In addition, at least a portion of the first insulating layer 111 may be disposed in the first flexible region F1 of the printed circuit board 100. Accordingly, the first flexible region F1 of the printed circuit board 100 may include a first insulating layer 111 and a plurality of connection pads 100P.

The first insulating layer 111 has a groove portion H penetrating a portion of the first insulating layer 111 in respective regions between the plurality of connection pads 100P. Accordingly, the groove portion H may also be disposed in the first flexible region F1 of the printed circuit board 100, similarly to the first insulating layer 111 and the plurality of connection pads 100P. The groove portion H may penetrate a portion of the first insulating layer 111 in each of the first insulating layers 111 in a direction from the one surface in which the connection pads 100P of the first insulating layer 111 are disposed, to the other surface, opposite to the one surface. Accordingly, a bottom surface of the groove portion H may be disposed at a level between the one surface and the other surface of the first insulating layer 111. However, in some cases, the groove portion H may penetrate the entire first insulating layer 111.

In the case of the display module according to the present disclosure, a plurality of groove portions H penetrating a portion of the first insulating layer 111 are formed in the first flexible region F1 of the printed circuit board 100 on which the bonding layer 200 is disposed. Therefore, when connecting the first flexible region F1 of the printed circuit board 100 to the display panel 300 through the bonding layer 200, the bonding layer 200 may fill at least a portion of each of the plurality of groove portions H. That is, the bonding layer 200 may be disposed in at least a portion of each of the plurality of groove portions H, and an adhesive area of the first insulating layer 111 in contact with the bonding layer 200 may be increased. For example, the bonding layer 200 may cover the wall surface and the bottom surface of each of the plurality of groove portions H, and may fill the interior of each of the plurality of groove portions H. Thereby, adhesion between the first insulating layer 111 and the bonding layer 200 may be secured. In addition, it is possible to improve the bonding strength between the printed circuit board 100 and the display panel 300.

The bonding layer 200 may be disposed between the printed circuit board 100 and the display panel 300 and may serve to attach the printed circuit board 100 and the display panel 300 to each other. In this case, as described above, the bonding layer 200 may be disposed in at least a portion of each of the plurality of groove portions H, and a sufficient adhesive area with the first insulating layer 111 may be improved. Therefore, the bonding strength between the printed circuit board 100 and the display panel 300 can be improved.

In addition, the bonding layer 200 may connect the connection pad 100P of the printed circuit board 100 and the connection pad 300P of the display panel 300. The bonding layer 200 may include a conductive material, and thus may electrically connect the connection pad 100P of the printed circuit board 100 and the connection pad 300P of the display panel 300. In this regard, the bonding layer 200 may include an anisotropic conductive film (ACF).

The display panel 300 may be connected to the printed circuit board 100 through a bonding layer 200 disposed between the printed circuit board 100 and the display panel 300.

The display panel 300 may serve to convert electrical signals into visual signals. The display panel 300 may be a flexible display panel such as an organic light emitting field display (OLED) panel, an electrophoretic display panel, an electrochromic display (ECD) panel, or the like. The display panel 300 may be a touchscreen panel, but is not limited thereto.

The display panel 300 may include a plurality of connection pads 300P, the connection pad 100P of the printed circuit board 100 and the connection pad 300P of the display panel 300 may be electrically connected to each other through the bonding layer 200 disposed between the printed circuit board 100 and the display panel 300.

In the drawing, the connection pad 300P is illustrated as protruding onto one surface of the display panel 300, but is not limited thereto, and all or a part of the connection pad 300P may be embedded on one surface of the display panel 300.

As a formation material of the connection pad 300P, conductive materials such as copper (Cu), aluminum (Al), silver (Ag), tin (Sn), gold (Au), nickel (Ni), lead (Pb), titanium (Ti), or alloys thereof can be used.

Each of the plurality of connection pads 300P of the display panel 300 may be disposed to correspond to each of the connection pads 100P of the printed circuit board 100. Accordingly, each of the plurality of connection pads 300P of the display panel 300 may be physically and/or electrically connected to each of the connection pads 100P of the printed circuit board 100. In a similar viewpoint, each of the plurality of connection pads 300P of the display panel 300 may be disposed such that all or a part thereof overlap each of the connection pads 100P of the printed circuit board 100.

The plurality of connection pads 300P may be disposed spaced apart from each other, for example, may be disposed substantially parallel so as not to overlap each other. However, the present disclosure is not limited thereto, and may be disposed in a wedge shape in which a gap between the plurality of connection pads 300P widens from one side to the other side of the connection pad 300P along a longitudinal direction of the connection pad 300P as a non-limiting example. The longitudinal direction of the connection pad 300P may be a direction perpendicular to the direction in which the plurality of connection pads 300P are disposed.

The display module according to an example may further include electronic components 400 and 500. At least a portion of the electronic components may be an electronic component 400 mounted on the printed circuit board 100 or an electronic component 500 mounted on the display panel 300.

The electronic components 400 and 500 may be display device IC (DDI) chips. However, the present disclosure is not limited thereto, and each of the electronic components 400 and 500 may include an active component such as a semiconductor chip, and may include a passive component such as an inductor or a capacitor.

Other descriptions are substantially the same as those described above, and detailed descriptions thereof are omitted.

As used herein, one side, one surface, and the like are used to describe a side, a surface, opposite to the other side, the other surface, and the like. However, this is for convenience of description and is not intended to limit a specific direction. For example, one side and one surface in one description may be interpreted as the other side and the other surface in another description.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment may be used in other embodiments, even if it is not described in the other embodiments, unless it is described contrary to or inconsistent with the context in the other embodiments.

The terms used in the example embodiments are used to simply describe an example, and are not intended to limit the present disclosure. A singular term includes a plural form unless otherwise indicated.

As set forth above, as one effect of various effects of the present disclosure, a printed circuit board having an increased adhesive area with a bonding layer and a display module including the same can be provided.

As another effect of various effects of the present disclosure, a printed circuit board with improved adhesion to a bonding layer and a display module including the same can be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
   a first insulating layer comprising:
      a plurality of connection pads disposed on one surface of the first insulating layer, at least two of the plurality of connection pads are spaced apart from each other in a first direction, and
      groove portions penetrating a portion of the first insulating layer and arranged between adjacent connection pads, among the at least two of the plurality of connection pads, in the first direction.

2. The printed circuit board of claim 1, wherein the groove portions arranged between the adjacent connection pads are connected to each other.

3. The printed circuit board of claim 1, wherein the plurality of connection pads and the groove portions are alternately disposed on a plane.

4. The printed circuit board of claim 1, further comprising a flexible region and a rigid region,
   wherein the plurality of connection pads and the groove portions are disposed in the flexible region.

5. The printed circuit board of claim 1, wherein a wall surface of the groove portions comprises a region having a shape extending from a corresponding side surface of the plurality of connection pads.

6. The printed circuit board of claim 1, wherein a wall surface of the groove portions on a plane comprises a region in contact with a corresponding side surface of the plurality of connection pads.

7. The printed circuit board of claim 1, wherein a width of the groove portions becomes narrower from the one surface of the first insulating layer to another surface, opposite to the one surface.

8. The printed circuit board of claim 1, wherein at least one of a wall surface or a bottom surface of the groove portions has a region having a curved surface.

9. The printed circuit board of claim 1, wherein the plurality of connection pads protrude from the one surface of the first insulating layer.

10. The printed circuit board of claim 1, wherein a bottom surface of the groove portions is disposed at a level between the one surface of the first insulating layer and another surface, opposite to the one surface.

11. The printed circuit board of claim 1, wherein the groove portions, when viewed in a plan view, have a shape selected from the group consisting of: a circle, a triangle, square, a rectangle, a hexagon, and a regular or an irregular convex polygon.

12. The printed circuit board of claim 1, wherein the groove portions are arranged in a second direction perpendicular to the first direction.

13. A display module, comprising:
a printed circuit board having a flexible region and including an insulating layer comprising:
a first connection pad disposed on one surface of the insulating layer, and
groove portions penetrating a portion of the insulating layer in the flexible region of the printed circuit board;
a display panel including a second connection pad disposed on the flexible region of the printed circuit board; and
a bonding layer disposed between the flexible region of the printed circuit board and the display panel, and connecting the first connection pad and the second connection pad.

14. The display module of claim 13, wherein the insulating layer further comprises a plurality of first connection pads and the groove portions are disposed in a region between adjacent of the plurality of first connection pads.

15. The display module of claim 13, wherein the bonding layer comprises an anisotropic conductive film.

16. The display module of claim 13, wherein the bonding layer electrically connects the first connection pad and the second connection pad.

17. The display module of claim 13, wherein the bonding layer is disposed in at least a portion of each of the plurality of groove portions.

18. The display module of claim 13, wherein the display panel comprises a flexible display panel selected from a group consisting of an organic light emitting field display (OLED) panel, an electrophoretic display panel, an electrochromic display (ECD) panel, and a combination thereof.

19. The display module of claim 13, wherein the display panel comprises a touchscreen panel.

20. A printed circuit board, comprising:
a first insulating layer comprising:
a plurality of connection pads disposed on one surface of the first insulating layer, and
groove portions penetrating a portion of the first insulating layer, and
a flexible region and a rigid region,
wherein the groove portions are disposed in a region between adjacent connection pads of the plurality of connection pads, and
wherein the plurality of connection pads and the groove portions are disposed in the flexible region.

* * * * *